US012555750B2

(12) United States Patent
Witham et al.

(10) Patent No.: US 12,555,750 B2
(45) Date of Patent: Feb. 17, 2026

(54) MICRO-CAPILLARY HIGH VOLTAGE ISOLATOR FOR GAS DELIVERY TO VACUUM

(71) Applicant: Oregon Physics, LLC, Beaverton, OR (US)

(72) Inventors: Philip J. Witham, Portland, OR (US); Neal R. Landreville, Hillsboro, OR (US)

(73) Assignee: Oregon Physics, LLC, Beaverton, OR (US)

( * ) Notice: Subject to any disclaimer, the term of this patent is extended or adjusted under 35 U.S.C. 154(b) by 443 days.

(21) Appl. No.: 18/206,659

(22) Filed: Jun. 7, 2023

(65) Prior Publication Data

US 2024/0412952 A1 Dec. 12, 2024

(51) Int. Cl.
*H01J 37/32* (2006.01)

(52) U.S. Cl.
CPC .. *H01J 37/32449* (2013.01); *H01J 37/32816* (2013.01)

(58) Field of Classification Search
CPC ...................... H01J 37/32449; H01J 37/32816
See application file for complete search history.

(56) References Cited

U.S. PATENT DOCUMENTS 4,172,021 A * 10/1979 Gladish .................. C23C 14/34 204/192.12
11,651,928 B2 * 5/2023 McGinn .................. H01J 37/02 250/428
2008/0220596 A1 * 9/2008 Olander .................. H01J 27/02 257/E21.334
2024/0339302 A1 * 10/2024 Sarode Vishwanath .................... H01J 37/3244

* cited by examiner

*Primary Examiner* — Benjamin Kendall
(74) *Attorney, Agent, or Firm* — Schaffer IP Law, LLC

(57) ABSTRACT

A gas delivery conduit configured to deliver gas to a device comprises an input end maintained at a first potential into which a gas is delivered from a source under a regulated pressure, a pressure regulator coupled to the input end for delivering a regulated flow of gas to the conduit, and an output end maintained at a second potential through which the gas is delivered to the device, with a direction of gas flow moving through the conduit from the input end to the output end. The potential difference between the first potential and second potential forms an electric field. A first plurality of electrically nonconductive conduit windings is disposed between the input end and output end and arranged such that the electric field running between the input end and output end runs substantially perpendicularly across the plurality of conduit windings and the direction of gas flow through the conduit.

24 Claims, 8 Drawing Sheets

MICRO-CAPILLARY HIGH VOLTAGE ISOLATOR FOR GAS DELIVERY TO VACUUM

BACKGROUND OF THE INVENTION

1. Field of the Invention

This invention relates generally to methods and systems for reliably delivering a controlled gas flow rate across a high voltage differential from inlet to outlet, such as in plasma ion sources, and to optionally return gas separately or simultaneously from vacuum pressures and high voltage to a pressure sensor at ground potential.

2. Description of the Prior Art

The delivery of a gas to equipment operating at high voltages can create possible high voltage breakdown and arcing through the gas line where the gas moves from a ground potential at the input to the gas line to a high potential at the output of the gas line to the equipment. An exemplary device where this can become a critical issue is with focused ion beam (FIB) tools. Focused ion beam (FIB) tools are used for nanometer scale precision material removal.

The benefits of FIB tools include nano-scale beam placement accuracy, a combined imaging and patterning system for accurate sample registration and pattern placement, and low structural damage of the area surrounding the removed volume. However, conventional FIB systems typically have a maximum removal rate of ~5 $\mu m^3/s$ that limits their usefulness for removing volumes with dimensions exceeding 10 μm. Conventional FIB systems are further limited by the low angular intensity of the ion source, so at large beam currents the beam size dramatically increases from spherical aberration. For high beam currents and hence high removal rates of material, a high angular intensity is required, along with high brightness and low energy spread.

Focused ion beams are often referred to as 'primary' ion beams when used on secondary ion mass spectrometer (SIMS) systems. Here the term 'primary' is used to differentiate it from the secondary ion beam. As with FIB tools, SIMS tools use the focused primary ion beam for precise, sputter removal of atoms and molecules from a material surface. SIMS tools are primarily used to determine the spatial distribution of chemical constituents in the near surface region of a material. Oxygen primary ion beams are beneficial to enhance the yield of positively charged secondary ions from the sample material, and hence enhance the sensitivity of the SIMS measurement. Negatively charged oxygen ion beams, not only enhance the yield of positively charged secondary ions, but also result in minimal sample charge buildup when the sample is a dielectric material. The state-of-the-art SIMS instruments employ duoplasmatron ion sources to produce negative oxygen primary ion beams. Duoplasmatrons have insufficient brightness (~40 $Am^{-2}sr^{-1}V^{-1}$) and lifetime to produce the spatial resolution required for many SIMS applications. Duoplasmatrons also produce ion beams with a relatively large axial energy spread (~15 eV), which is also problematic when endeavoring to produce high spatial resolution focused primary ion beams.

One solution is to use an inductively coupled plasma ion source. Inductively coupled plasma ion sources typically wrap an RF antenna about a plasma chamber. Energy is transferred by inductively coupling power from the antenna into the plasma. A RF power supply with 50 Ohm output impedance utilizes an impedance matching network so that the output of the RF supply can be efficiently coupled to the plasma which has an impedance substantially different than 50 ohms. To extract negative ions from the ion source, it is typically necessary to use a transverse magnetic field near the source aperture to modify the plasma to allow negative ions to leave the plasma and to separate unwanted electrons that are extracted with the negative ion beam.

Other applications for this type of plasma source include its use as the primary ion source for Ion Scattering Spectroscopy (ISS), focused and projection ion beam lithography, proton therapy, and high energy particle accelerators.

In all cases, a high-power density is deposited into the plasma from the antenna in order to create a high-density plasma, and the plasma is biased to a potential of a hundred Volts or more with respect to ground. An ion beam is extracted from a small aperture and is accelerated through a bias voltage to produce a fine beam of energetic ions.

One issue in the design of plasma ion sources is how to create an optimum magnetic field near the extraction aperture while a high voltage bias is applied to the plasma chamber. A second issue is how to provide radio frequency power to the antenna when the effective impedance of the plasma is very different than common RF power supply output impedances. This is especially problematic because the effective impedance of the plasma varies with plasma chamber gas pressure, gas composition, and the change of state during plasma ignition.

A third problem is how to introduce gas into a reactor chamber that is biased to a high voltage without having high voltage breakdown through the input gas line. It is this third problem that is the focus of the present invention.

High voltage (HV) breakdown in a gas feed line results when a conducting cascade of ionized gas forms. This results when individual charged particles cause impact ionization and photo ionization of neutral gas molecules often enough to sustain ionization, and progressively farther along the gas column until the full path length from HV to ground is bridged. HV breakdown is thus caused by both ionization by gas ions and by secondary electrons. Secondary electrons are produced by both the impact of ions onto the isolator walls, and from ionization of gas molecules, and by photons (primarily UV and vacuum UV). These photons are produced by the neutralization of ions impacting the isolator walls, and which in turn generate secondary electrons when these photons impact the isolator walls.

Previously known systems used both a high voltage isolator and a separate flow control device (e.g., a piezoelectric leak valve). In most valved cases, the valve must be located at the full beam voltage end of the HV isolator to maintain high pressure through the isolator, thus keeping the isolator's gas passage out of the middle pressure area of the Paschen curves dictating breakdown voltage versus line pressure. The control of a valve must also then be isolated across the high voltage gap. This is either an insulating control shaft for a mechanical valve, or a transformer isolation circuit for a piezoelectric valve. But this solution has drawbacks of added complexity and problems with gas flow stability and limited control of gas flow.

Accordingly, the need arises for new designs and methods for providing a high performance, reliable, and easily manufactured way to deliver a controlled gas flow rate at common pressures across a high voltage differential from inlet to outlet within environments having high potential differentials such as plasma ion sources (where doing so would improve the stability of ion current output). A further need exists for such designs and methods that can separately or simultaneously return gas from vacuum pressures and high voltage to a pressure sensor at ground potential.

SUMMARY OF THE INVENTION

A gas delivery conduit configured to deliver gas to a device comprises an input end maintained at a first potential into which a gas at a regulated pressure is delivered from a source, a pressure regulator coupled to the input end for delivering a regulated flow of gas to the conduit, and an output end maintained at a second potential through which the gas is delivered to the device, with a direction of gas flow moving through the conduit from the input end to the output end, wherein a gas flow rate at the output end is dependent upon the regulated pressure delivered at the input end. The potential difference between the first potential and second potential forms an electric field. A first plurality of electrically nonconductive conduit windings is disposed between the input end and output end and arranged such that the electric field running between the input end and output end runs substantially perpendicularly across the plurality of conduit windings and the direction of gas flow through the conduit.

In another aspect of the invention, a gas delivery conduit comprises a spool having upper and lower ends, with outer annular portions of the spool maintained at a first potential and inner annular portions of the spool maintained at a second potential, different from the first potential, such that a radial electric field exists between the first and second potentials. The conduit further includes an elongate microcapillary arranged in a spiral having a plurality of windings interposed between the upper and lower ends of the spool, with one of an input end or output end at the first potential and the other of the input end or output end at the second potential. The microcapillary is configured to transfer a gas along the microcapillary in a flow direction substantially perpendicular to the electric field.

In yet another aspect of the invention, a method is disclosed where gas is flowed within a gas line between input and output ends having a large difference in potential to mitigate possible high voltage breakdown and arcing through the gas line. The method comprises the steps of arranging a plurality of adjacent windings of the gas line such that a cross-section of the gas line is substantially perpendicularly to an electric field created by the difference in potential between the input and output ends. Gas is then flowed along the gas line substantially perpendicular to the electric field. The arrangement can either be in a flat spiral, a three-dimensional spiral formed about a conical structure, or a cylindrical spiral formed about a cylindrical structure.

The arrangement of the gas line running perpendicular to the electric field created between the input and output ends mitigates electric breakdown or arcing since the potential difference across the microcapillary walls is relatively small compared to the potential difference that would occur between one end and another of a gas line if the conduit were more aligned in the direction of the electric field. A curvature of the microcapillary further prevents any emission from moving far in a straight line around the bend in the gas line. The more windings, the less the potential difference between opposing walls of the microcapillary and a reduced chance of breakdown or arcing within the gas line.

These spool shapes allow the electrostatic field to be smoothly and slowly tapered between the ends of the microcapillary, which is one factor in obtaining the maximum permissible beam voltage. This is particularly important where the conduit is coupled to a plasma chamber that is isolated from ground for processing semiconductors or supplying a source of charged particles to a substrate. The spool shape also puts the great majority of the electric field vector perpendicular to the direction of the tube's internal gas passage, as is nearly so with a large, short tubing spiral. In the case of the flat spool, inner (HV) and outer (ground) electrodes are coated onto insulating material. In the case of a cone-like spool, the cylindrical outer metal shell of the system and inner metal gas outlet fitting are the electrodes, and the cone and electrodes can be shaped to produce an ideal slope to the electric field over the capillary length.

At the same time, the long microcapillary is ideal for controlling gas flow, having the flow stability of a shorter capillary versus temperature, manufacturing precision, and aging. But it also allows a larger inside diameter (ID) for the required flow restriction. Where a short capillary requires few-micron or smaller internal diameters, a long capillary must use a larger ID, reducing its sensitivity to contamination by particles or adsorbed liquids, etc.

The foregoing and other objects, features and advantages of the invention will become more readily apparent from the following detailed description of a preferred embodiment of the invention that proceeds with reference to the accompanying drawings.

DETAILED DESCRIPTION OF THE INVENTION

Figure 1:
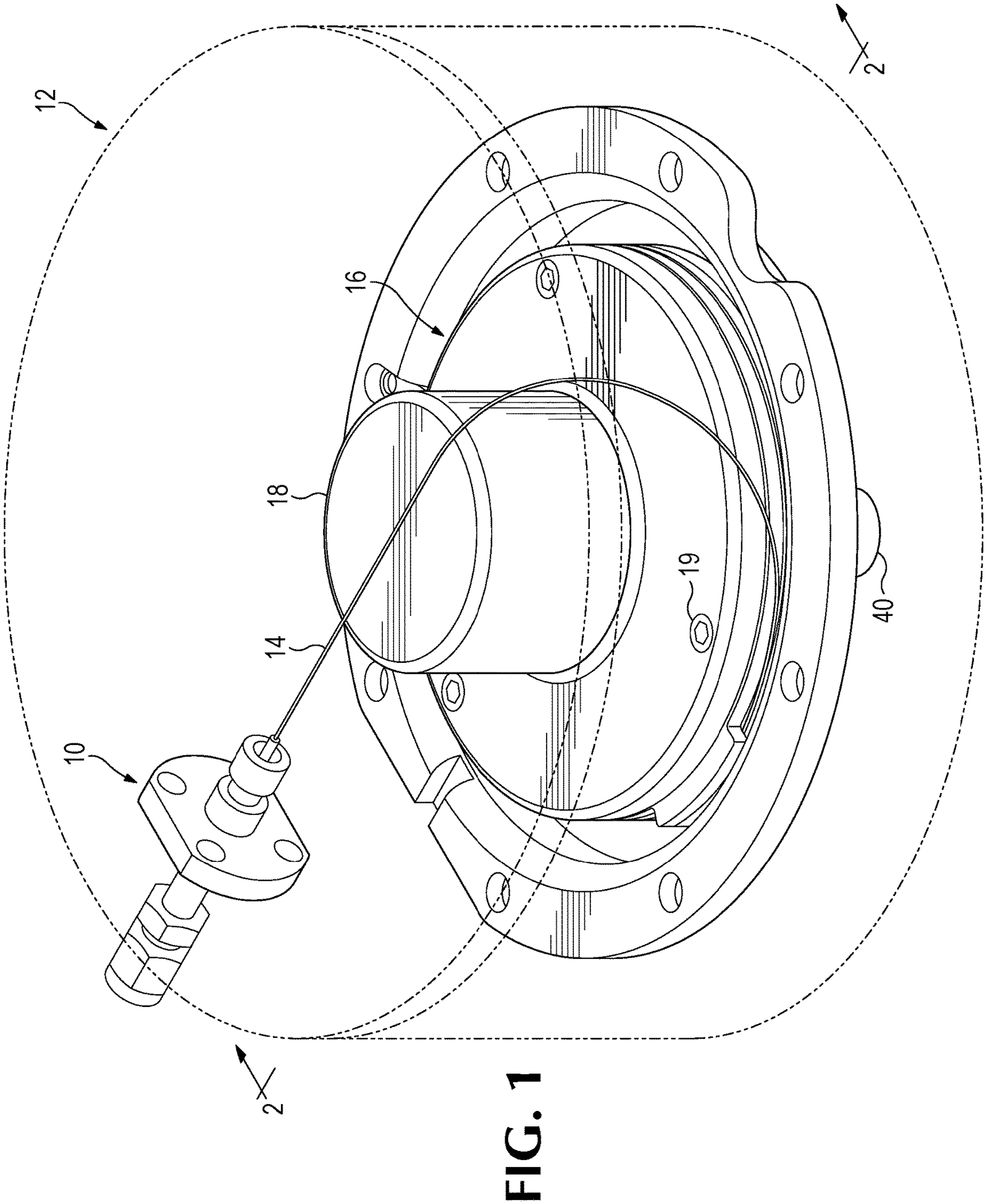
FIG. 1 is a perspective view of a microcapillary gas delivery system configured for operation in air according to a preferred configuration of the invention with dot-dash shadow lines illustrating the environment in which the system is implemented.

FIG. 1 shows a perspective view of a microcapillary gas delivery system (also referred to as μCHI, pronounced "meuCHI") configured for operation in air according to a preferred configuration of the invention with dot-dash shadow lines illustrating the environment in which the system is implemented. Here, gas is delivered through a first fitting 10 that is coupled through the sidewall of a metal enclosure 12 of a device (e.g., a focused ion beam system) to a microcapillary gas line 14. Gas line 14 runs through the device cap 18 to an assembly 16 and is disposed in a spiral form from larger diameter windings at the outside of the spiral to smaller diameter windings at the inside of the spiral as described further below, and output to a central metal hub 40 operating within a vacuum environment. Device cap 18 is coupled via screws 19 to an upper spool half 28 whose features and functions are discussed further below.

Figure 2:
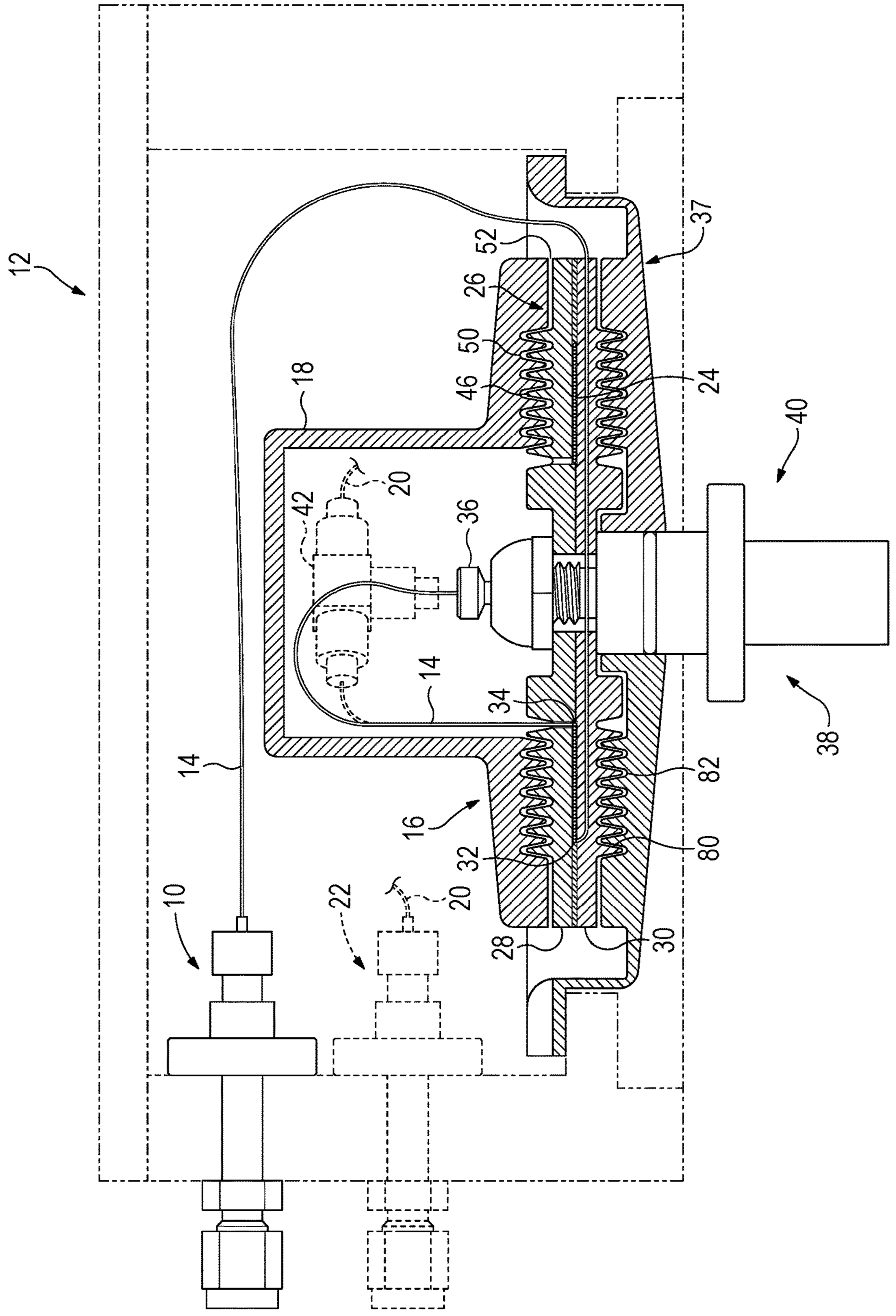
FIG. 2 is a side elevation section view taken along line 2-2 of FIG. 1 illustrating the microcapillary gas delivery system of the present invention, with dot-dash shadow lines illustrating the environment in which the system is implemented and dashed lines illustrating an alternate dual-line configuration.

FIG. 2 is a side elevation section view taken along line 2-2 of FIG. 1 illustrating the microcapillary gas delivery system of the present invention, with dot-dash shadow lines illustrating the environment—here device 12—in which the system is implemented and dashed lines illustrating an alternate dual-line configuration. In the dual line configuration noted as an alternate embodiment of the invention and described in more detail with reference to FIGS. 7A and 7B below, a second gas line 20 is coupled via a second fitting 22 to a pressure sensing device (not shown) to provide added capabilities to the system. The first gas line 14 is arranged in a flat spiral 24 within a spool assembly 26 and sandwiched between upper 28 and lower 30 halves of the spool, entering at an outer input end 32 of the spiral 24 and exiting at an inner output end 34 of the spiral 24. The output end 34 then runs into a fitting 36 at the top of device column 38, where gas is delivered to the central metal hub 40 of the focused ion beam system operating at high voltage, whereupon the gas is ionized by application of induction coils (not shown). In the dual line configuration, gas line 14 enters the left side of T-fitting 42, and secondary gas line 20 runs into the right side of T-fitting 42 and thence through capillary fitting 36 and to central metal hub 40. As will be appreciated with further description below, the outer portion of the spool assembly 26 is maintained at a low (e.g., ground) potential while the inside portion is maintained at a higher potential—and typically within devices such as FIBs in the range of about +-500V and +-50 kV range—thus creating a radial electric field running between these two potentials and across the spiral 24 of the gas line 14 (and, in the alternate embodiment, also second gas line 20).

Figure 3:
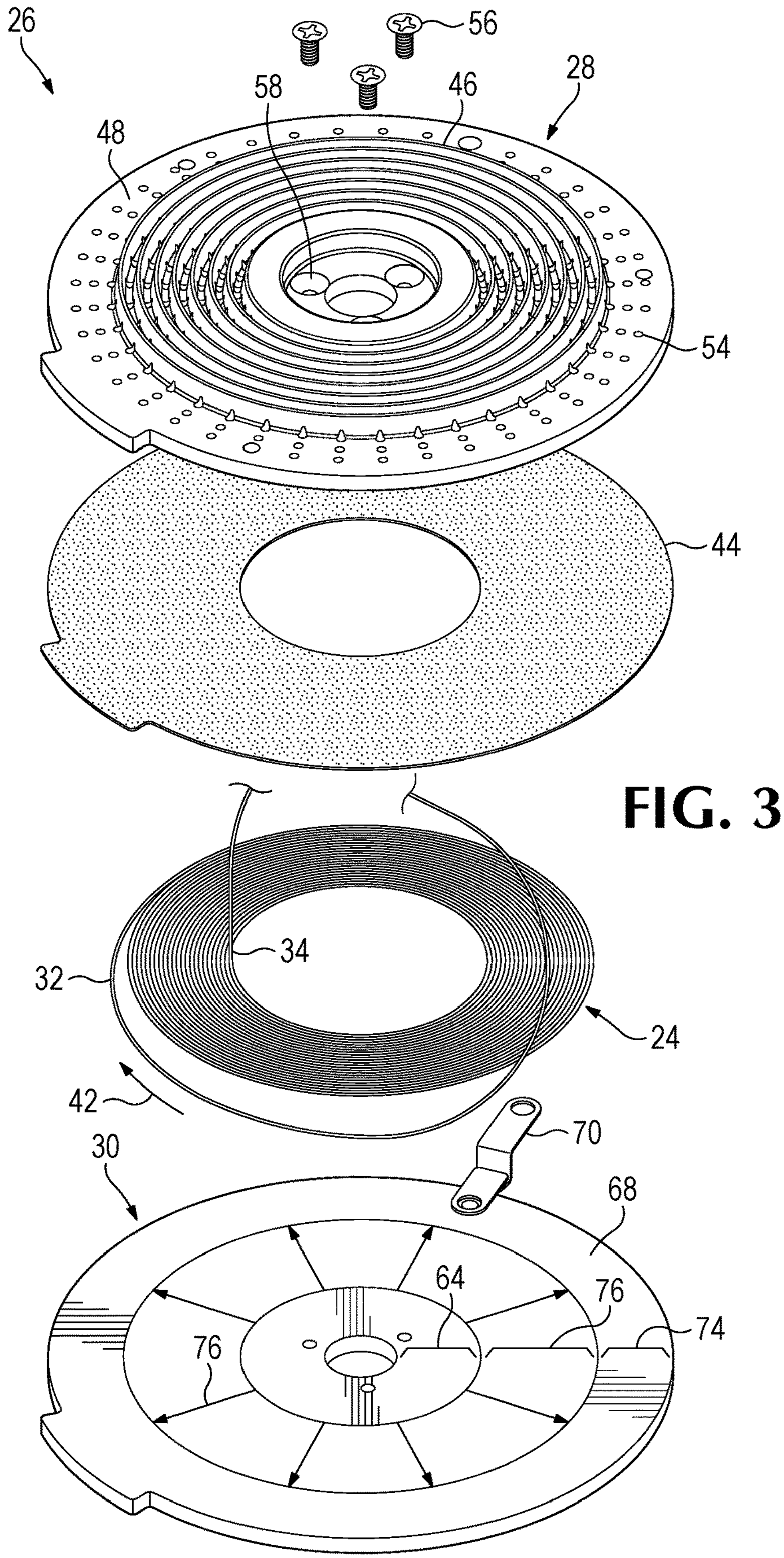
FIG. 3 is an exploded perspective view of the spool assembly of the microcapillary gas delivery assembly of FIG. 2.

FIG. 3 is an exploded perspective view of the microcapillary gas delivery assembly denoted by spool halves 28 and 30. A key element of the spool assembly 26 is the microcapillary—here shown in a flat spiral 24 orientation—with a direction 42 of gas flow running from an input end 32 on an outside of the spiral 24 to an output end 34 on an inside of the spiral 24. The gas flow direction thus flows in an ever-decreasing spiral from outside to inside. It is understood, however, that the orientation can be flipped where the input end is on an interior of the spiral and an output end is on the exterior of the spiral and the gas flow direction spirals from inside to outside.

Preferably, the tubing used for the gas line within flat spiral 24 is of 0.5 meter or greater length and made of a flexible insulating material such as 0.1 to 3 mm outside-diameter (OD) fused silica and polyimide "microcapillary." The microcapillary is wound into a spiral form, such as on a spool formed of an insulative materials to pack this length in a compact form. A preferable insulative material used throughout various parts of the delivery system is a polyether ether ketone (PEEK), which exhibits the following properties: high dielectric strength, good dimensional stability, and strength at up to 150° C. Alternate materials that can be used include glass, quartz, and polycarbonate or other structurally rigid insulators.

The tubing inside diameter (ID) is sized to provide the desired gas flow rate with an inlet pressure in an easily provided range. In application to plasma ion sources this ID could range from 10-200 μm, with about a 75 μm fitting most preferred. In a more specific implementation, a length of about 4-10 meters of 75 μm ID tubing is used for an inlet pressure range of 0.1 to 3 atmospheres absolute over the variety of gasses and flow rates desired.

A key point to this design is that using a long tube of the correct ID results in an ID that is larger than the flow-controlling diameter (aperture or capillary) of any alternative implementation using a conventional short tube and handles both the flow control/restriction task and high voltage isolation in a single component while providing better resistance to clogging from contaminants.

If a spool shape is used, an insulating material such as PEEK provides a form for a single layer pack of tubing, ideally spiraling on a spiraling path having a smaller diameter at the high voltage end of the spool to a larger spiraling diameter path at the ground potential end. While the preferred implementation is a flat pancake spool with a gap only wide enough to permit one layer of tubing to stack into a spiral as shown in FIG. 3, other configurations are possible such as a cone (FIG. 9A) or straight cylindrical spool (FIG. 9B).

In the present preferred implementation, there are at least five windings of the flat spiral 24 and more preferably at least ten windings, with the most preferred implementation being approximately 4-10 meters of 360 μm OD of polyimide coated, fused silica tubing wound about 20-50 turns into a spool roughly 8 cm in diameter. The windings are preferably immediately adjacent to one another, although spacing between adjacent windings is possible despite potentially causing an increased potential difference between adjacent outer surfaces of the microcapillaries. This spool, and particularly flat spiral 24, is potted in a high voltage insulating compound 44 for use in air, or perforated and immersed in a dielectric liquid such as Galden™ Removable fittings 10, 22 and 36 connect this tubing to the low voltage outer end (gas supply or transducer) and to the high voltage (vacuum) inner end, respectively.

This potted implementation of the capillary spool puts the spool and inlet and outlet fittings in air, rather than in the Galden™ insulating fluid used by ion sources. This allows disassembly/assembly of the system without wetting the gas fittings with the fluid. To do this, the gas outlet to the central metal hub 40 (and thence to a FIB chamber) passes through a PEEK barrier plate 37, sealed with O-rings. The microcapillary spool 26—sitting upon hub 40 and floating above barrier plate 37 to create a rising and falling airgap therebetween having an extended pathway—has surfaces shaped into concentric rings much like high voltage insulators on power lines (e.g., crenellation structures 50 and 80 described below). This increases the path length along the surface of the spool for high voltage conduction and helps mitigate arcing and corona discharge. This increases the maximum operating voltage before electrical breakdown (e.g., small or large failures). Additionally, these rings are sandwiched between similar, interlocking rings on the fluid barrier plate 37 below and a top hat cap ("shield") 18 above, which can be interposed between the capillary and the dielectric cooling fluid. This also causes the direct (through air) arc path length to be increased nearly as much as the surface path length is.

While the μCHI spool is capable of being immersed in dielectric fluid, it can also be located in air with attention to normal HV design issues. This allows the gas fittings to be out of the coolant, allowing the spool and gas fittings to be changed without risk of gas system contamination.

Figure 4:
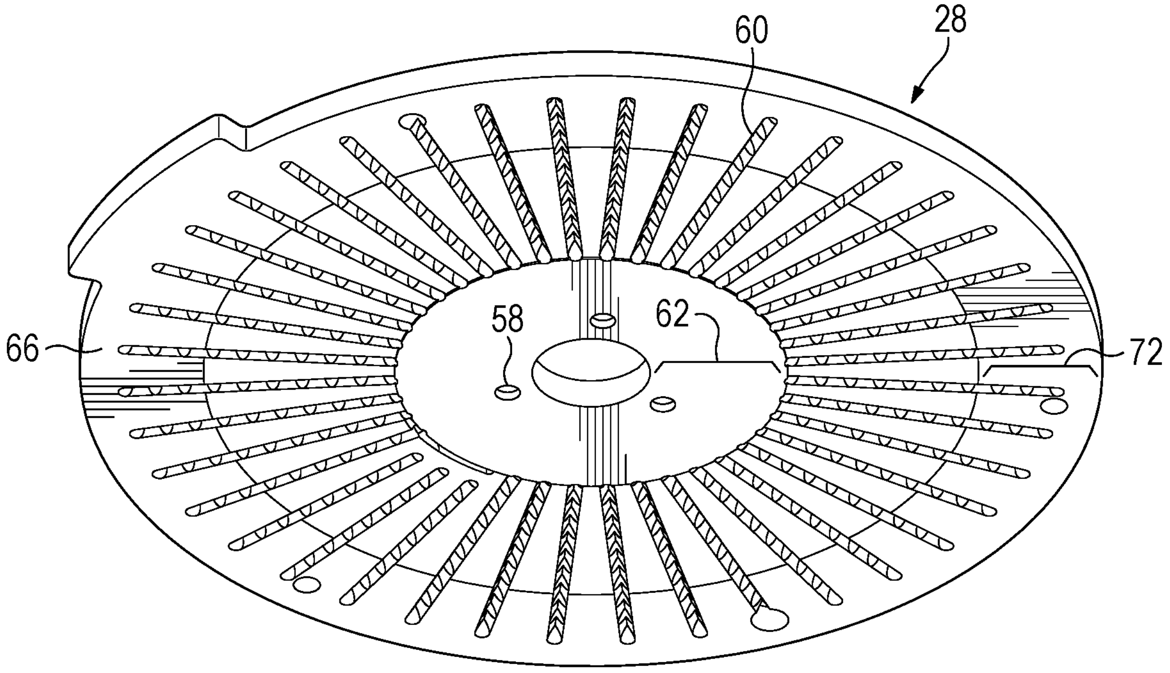
FIG. 4 is a perspective view of an underside of the spool top half illustrated in FIG. 3.

Top half 28 of spool is configured as a circular disk with a series of concentric annular ridges or crenellations 46 disposed on a top surface 48 thereof. These crenellations 46 mate with complimentary crenellation structures 50 formed on an underside of the device framework 16, with a narrow rising and falling airgap 52 therebetween as shown in FIG. 2 to decrease potential discharge by increasing the surface path length between the opposing elements. This airgap may be optionally closed due to a coupling of the cap 18 to the upper spool half 28 via screws 19. A radial array of apertures 54 (and, additionally, radial grooves 60 formed on an underside of the spool top half 28-FIG. 4) are formed through the upper half of spool to vent air during manufacture, from the potting material 44 into which the microcapillary flat spiral 24 is embedded.

A series of metallic screws 56 extend through apertures 58 formed in the spool top half 28 and couple the top half 28 together with the spool bottom half 30, with the microcapillary flat spiral 34 and potting material 44, captured between them to form the spool assembly 26. As will be explained further below, the metallic screws 56 electrically couple inner conductively coated annular portions 62 (FIG. 4), 64 (FIG. 3) formed on bottom 66 and top 68 surfaces of the upper and lower spool halves 28, 30, respectively, to maintain them at the same potential. A metallic tab 70 is embedded within the potting material 44 but contacts and electrically couples outer conductively coated annular portions 72 (FIG. 4), 74 (FIG. 3) formed on bottom 66 and top 68 surfaces of the upper and lower spool halves 28, 30, respectively, so that they are at the same (lower, and preferably ground) potential. Conductive coatings are preferably formed along these annular portions 62, 64, 72, 74. Because the radial grooves 60 do not extend completely to the edge of the bottom surface 66 of the upper spool half 28, all parts of outer conductive annular ring 72 are electrically connected to the same potential via tab 70.

The potential difference between the inner ring 62, 64 and the outer ring 72, 74 causes a radial electric field 77 passing from the area of high potential (the microcapillary output 34 and inner ring 62, 64) to the area of lower (e.g., ground) potential (the microcapillary input 32 and outer ring 72, 74). Although the microcapillary flat spiral 24 is preferably embedded in the non-conductive central ring portion 76 between these two sets of conductive inner and outer rings, the electric field 77 will still pass through the windings of the microcapillary and affect the behavior of the gas passing through it.

Figure 5:
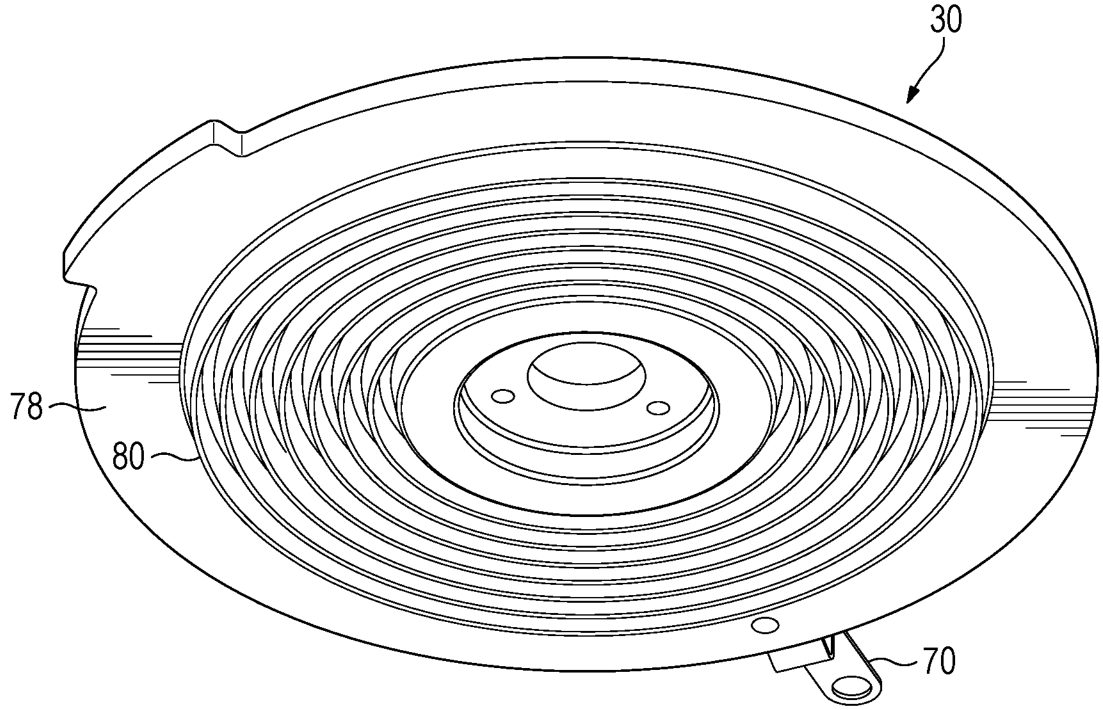
FIG. 5 is a perspective view of an underside of the spool bottom half illustrated in FIG. 3.

FIG. 5 illustrates the underside 78 of the bottom half 30 of spool assembly 26. And reverse to the annular crenellations 46 formed on the topside 48 the top spool half 28 shown in FIG. 3, the bottom spool half 30 includes a series of concentric annular ridges or crenellations 80 disposed on an underside 78 thereof. These crenellations 80 mate with complimentary crenellation structures 82 formed on a topside of the lower half of device framework 16, with a narrow rising and falling airgap therebetween as shown in FIG. 2 so as to decrease potential discharge by increasing the surface path length between the opposing elements.

Figure 6A:
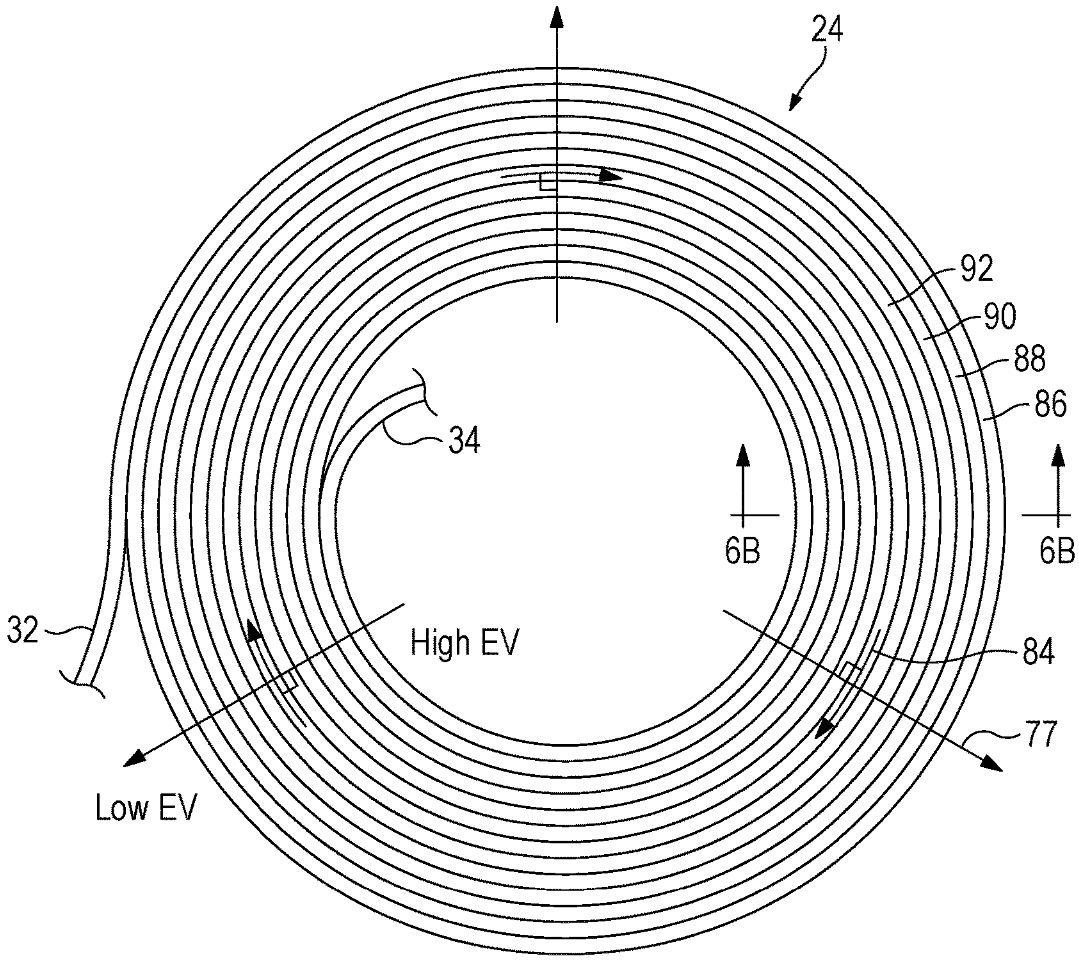
FIG. 6A is a top plan view of the microcapillary spiral windings of the assembly of FIG. 3 moving from a gas input on the outside of the spiral set at ground potential and an output on the inside of the spiral set at a high potential.
Figure 6B:
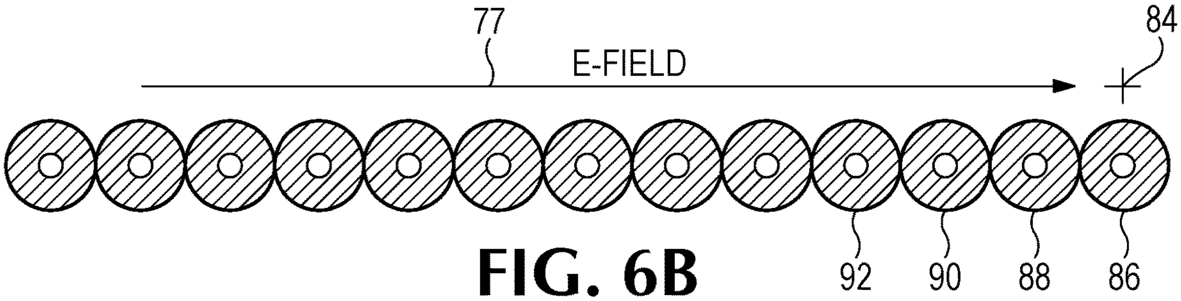
FIG. 6B is a section taken along line 6B-6B of FIG. 6A.

FIGS. 6A and 6B illustrate top and side section views, respectively, of the microcapillary 24 formed in a flat spiral configuration such that gas flows in a spiral direction 84 substantially orthogonal to a radial direction of the spiral and thus substantially perpendicular to the radial direction of the electric field 77 formed by the potential different between high voltage (inner) and low voltage (outer) areas. The microcapillary spirals inward from input end 32 to output end 34 over a long path that gradually increases the potential along the path as it very slowly moves to the center. This is akin to the threads on a screw very slowing (but strongly) embedding into a surface, or a car jack slowly but strongly lifting a much heavier object. FIG. 6B best illustrates 25 the multiple adjacent windings—such as adjacent windings 86, 88, 90, and 92—where the direction of gas flow is out of the page and is perpendicular to the e-field direction 77. Each of the microcapillaries includes an insulative outer jacket encapsuling a smaller inner diameter conduit through which the gas flows. Preferably, these windings are contiguous with adjacent windings—such as winding 88 being contiguous with adjacent outer winding 86 and inner winding 90.

It is desirable to control the electric fields through the tubing length deterministically and to prevent a high voltage differential from appearing across the short tubing lengths extending from the spool to the inlet and outlet fittings. To do this, conductive surfaces are used on the ends of the spool, connected to the High Voltage and ground potentials, respectively. This is not necessary but is expected to be beneficial in the maximum voltage that can be applied reliably without high voltage breakdown. Painted on carbon coatings are used presently for this but it could be done with metal components or layers. For the pancake spool this means an inside radius of the spool is coated conductively and connected to the high voltage, and an outside radius of the spool is coated and connected to ground.

The μCHI spool can be wound with two microcapillary tubes (in interlaced spirals), both connected to the outlet of the gas. The second tube can return to a gas pressure sensor at ground potential, allowing direct measurement of the gas outlet pressure. This has heretofore been only unreliably inferred from a downstream pressure in a vacuum system which is affected by several other factors and measured by notoriously inaccurate high vacuum sensors, such as cold cathode gauges. The capillary returned pressure is much higher, is not ionized, is at room temperature and has fewer things to cause composition changes. It could be measured by a capacitive manometer sensor, making the reading gas composition independent.

The easily controlled flow resulting from μCHI's extreme stability, monotonicity (no control reversals), resolution (no stick-slip behavior) and repeatability should make automatic control of the optimum plasma source chamber pressure more practical, which would be a great benefit for users of ion beam sources.

Figure 7A:
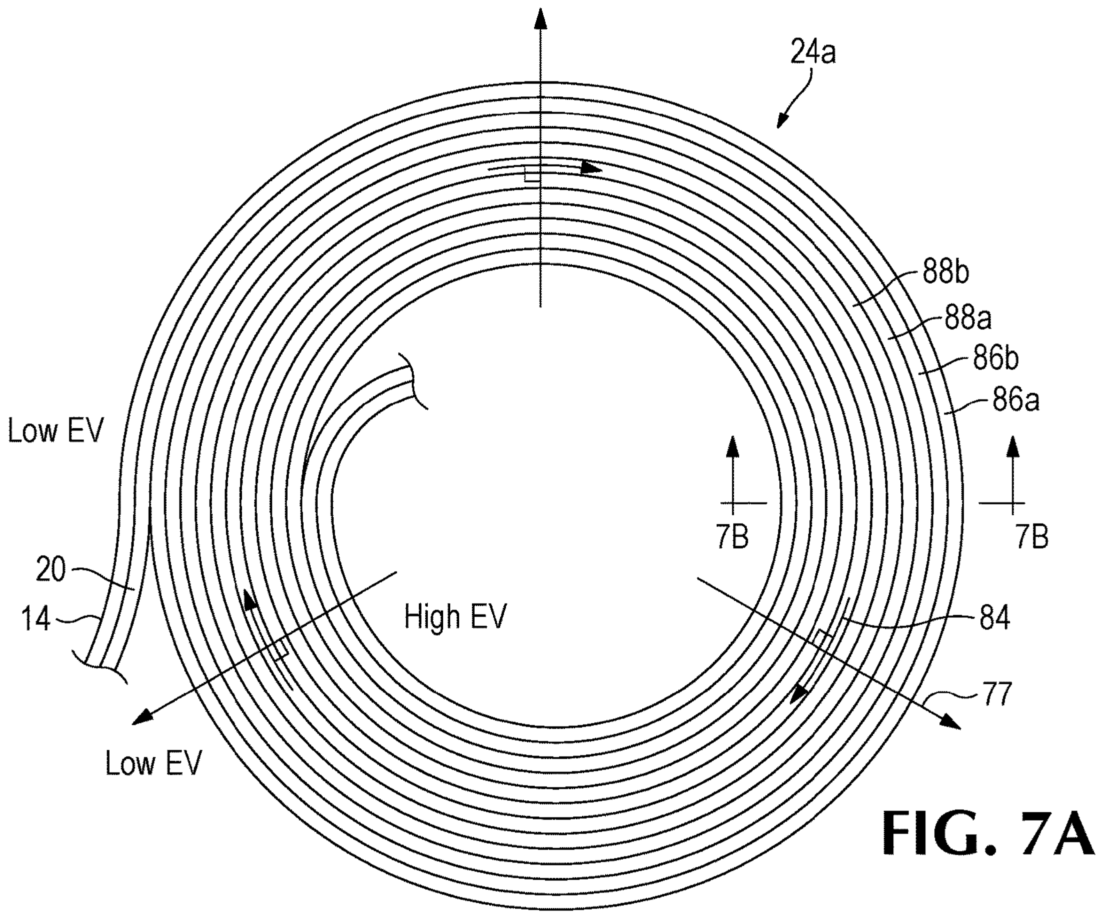
FIG. 7A is a top plan view of an alternate, dual-line configuration of the microcapillary spiral windings of the assembly of FIG. 3 moving from a gas input on the outside of the spiral set at ground potential and an output on the inside of the spiral set at a high potential.
Figure 7B:
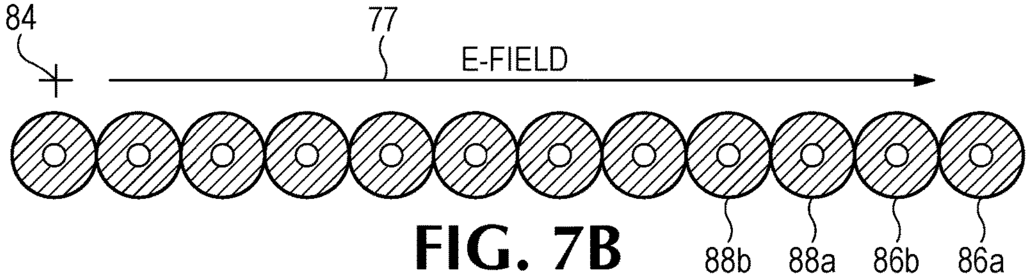
FIG. 7B is a section taken along line 7B-7B of FIG. 7A.

FIGS. 7A and 7B illustrate this alternate dual-conduit structure where, in order to sense the level of pressure at the vacuum (high voltage) end (such as at the gas delivery exit into an ion source), another microcapillary tube is run along the same path in the same spool or a separate one. As illustrated, and incorporating the structure shown in shadow lines in FIG. 2, a second microcapillary tube 20 can run parallel to the main gas supply line 14 within the flat spiral 24*a*. A pressure transducer at ground potential can then be connected to the other end of this microcapillary. Both supply 14 and sense 20 tubes may be packed into the same spool 24*a*, the two are simply run parallel to each other and wound on the spool together. At the vacuum delivery end at the inner portion of the spiral, they are interconnected by a T-fitting 42 as shown in FIG. 2 or into two separate fittings that direct the gas into the same central metal hub 40.

FIG. 7B best illustrates the multiple adjacent windings-such as adjacent windings 86*a*, 86*b* (denoting the outer spiral windings for the supply and sense tubes, respectively), and the next-inward adjacent windings 88*a*, 88*b*—where the direction 84 of gas flow is out of the page and is perpendicular to the e-field direction 77.

Figure 8:
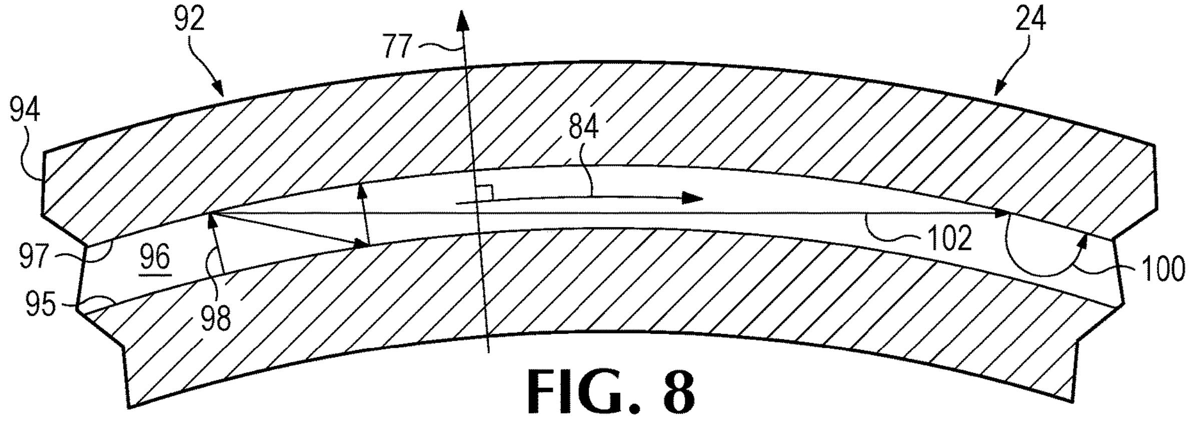
FIG. 8 is a top-plan section view of a magnified portion of the microcapillary of FIG. 6A illustrating particle and secondary photon paths across and along the bend of the microcapillary.

FIG. 8 shows a magnified section view of a small arc or subtended curving portion of microcapillary winding 92, where the direction of gas flow 84 through the winding is substantially orthogonal to the direction of the electric field 77 created by the high potential difference between the inner diameter of the microcapillary flat spiral 24 and the outside diameter. Each of the microcapillaries includes an insulative outer jacket 94 encapsuling a smaller inner diameter conduit 96 through which the gas flows. Conduit 96 is characterized by a smaller diameter inside surface 95 and a larger diameter outside surface.

The longer length and small OD results in better HV isolation (higher maximum voltage) for several reasons. The tube ID being smaller than the gas spaces within other HV isolator designs, and the large number of turns, results in a lower voltage step across the gas (e-field direction, across the ID). Thus, lower energy is imparted on charged particles 98 which accelerate across the space before impact with the wall. This results in fewer and/or lower energy secondary charged particles 100 and photons 102 from those charges to start a conduction cascade. Smaller internal diameter than alternative HV isolators also results in a shorter distance along the gas passage before a secondary photon intercepts a wall. FIG. 8 shows some of the longer paths 102 available to photons, and why the clear path distances are related to the tubing inside diameter and curving path to form the winding 92.

That is, FIG. 8 further exemplifies considerations related to the ability of an electrical discharge traveling down the inside of a curved tube, such as a capillary. Arrows show some possible charged particle and secondary electron and photon emission paths. Charged particles are shown travelling in radial directions according to the electric field directions, arranged to be generally perpendicular to the gas path. Aligning the e-field perpendicular to the gas path is the main advantage of a spiral capillary tube since these charges hit the walls before travelling far down the gas path. Secondary photons emitted where those charged particles hit are shown travelling down the tubing bore some distance, which is made shorter by shrinking the tubing ID (thus, an advantage for a microcapillary). This is another effect which reduces the reduces the ability of a discharge in the gas from travelling far.

Figure 9A:
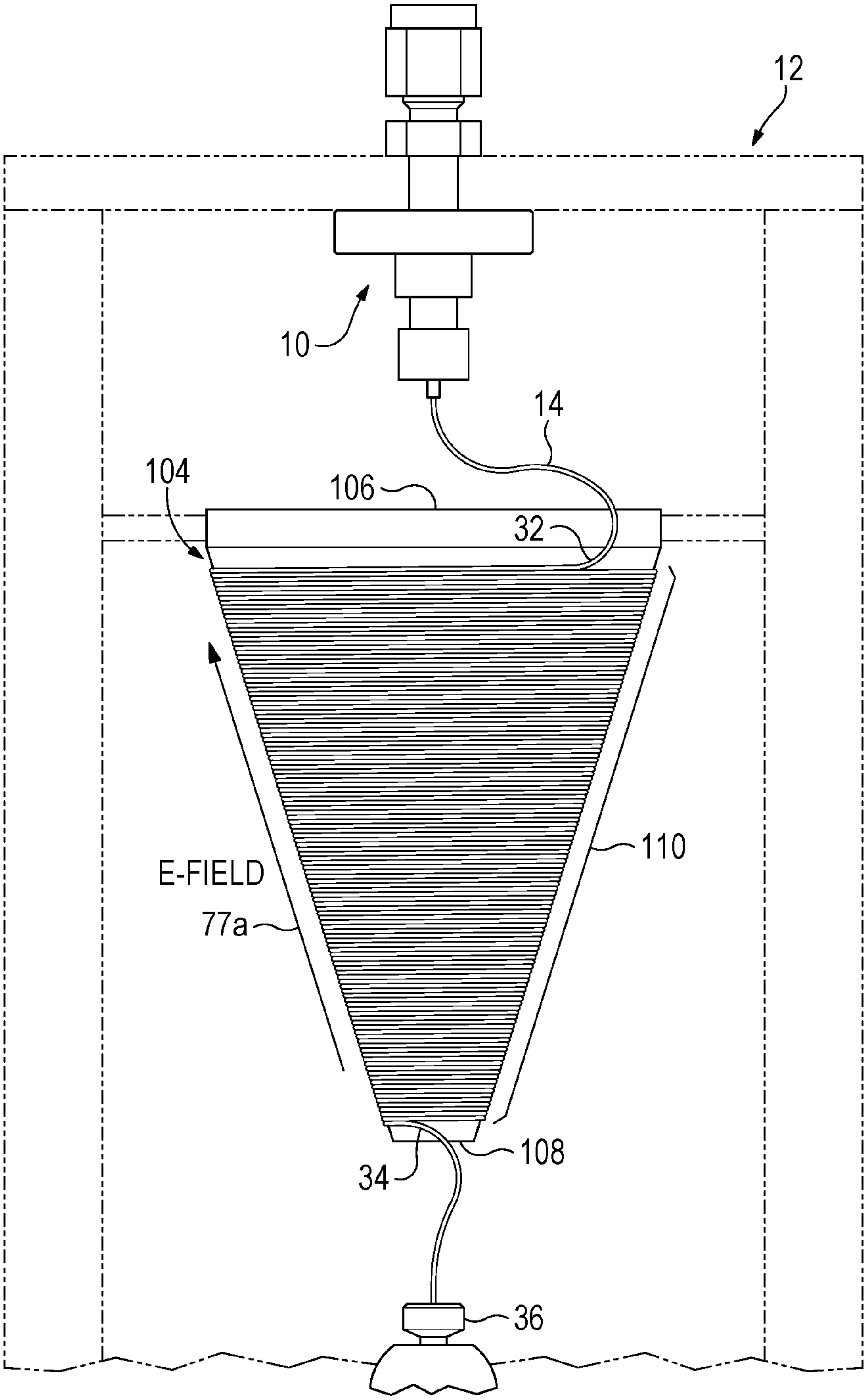
FIGS. 9A and 9B are side elevation views illustrating conical and cylindrical alternate embodiments, respectively, of the microcapillary gas delivery system of the present invention.
Figure 9B:
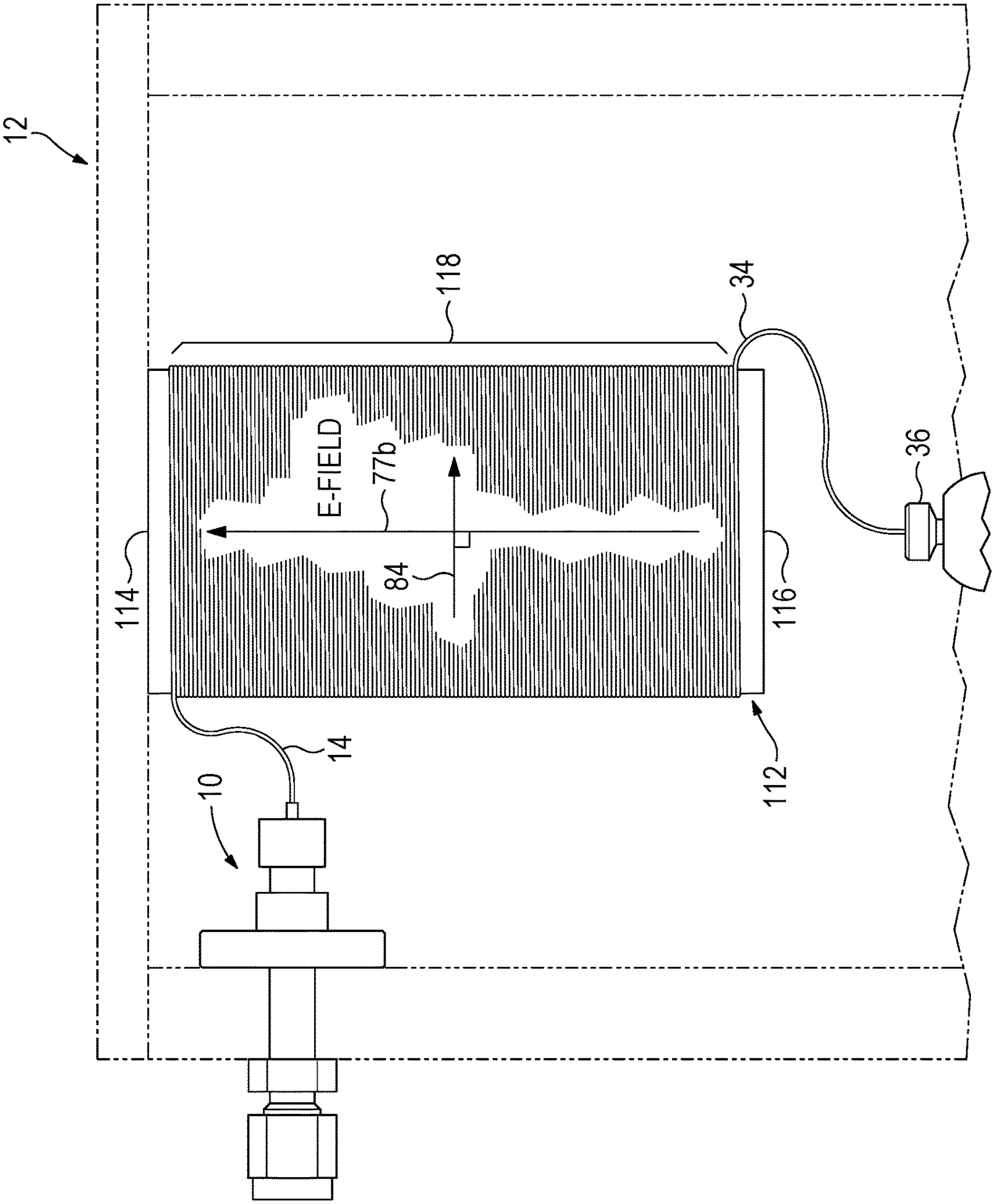

FIG. 9A illustrates an alternate embodiment to the capillary flat spiral 24 shown in the prior figures and described above. In the alternate embodiment, a microcapillary gas supply line 14 is wound about an insulative conical form 104 from a wider top end 106 maintained at ground to a narrower bottom end 108 coupled at a high voltage potential. When so wound, the microcapillary gas supply line forms a conical spiral 110 with a large plurality of windings that wrap around the conical form 104 with progressively smaller diameters. As with the previous embodiment, the direction of gas through the conduit is substantially perpendicular to the e-field 77*a* created by the potential difference between bottom 108 and top 106 ends of the conical spiral 110.

FIG. 9B illustrates yet another alternate embodiment to the capillary flat spiral 24 shown in the prior figures and described above. In the alternate embodiment, a microcapillary gas supply line 14 is wound about an insulative cylindrical form 112 from a circular top end 114 maintained at ground to a circular bottom end 116 coupled at a high eV potential. When so wound, the microcapillary gas supply line forms a cylindrical spiral 118 with a large plurality of windings that wrap around the cylindrical form 104 from the top to bottom ends 114, 116. As with the previous embodiment, the direction 84 of gas through the conduit is substantially perpendicular to the e-field 77*b* created by the potential difference between bottom 116 and top 114 ends of the cylindrical spiral 118. Preferably, the top 114 of the cylindrical form 112 should be near the grounded cap 12 of the device with the sidewalls being spaced at least twice the diameter of the cylindrical form 112.

The μCHI design requires no valve, and as a result the flow rate is affected by the inlet pressure, gas composition, and temperature, and essentially nothing else. The fused silica tubing used is extremely stable, long lived and has a low thermal expansion coefficient. The problem of adjusting the flow rate is "exported" to the ground potential end (inlet side), where the pressure can be controlled by feedback from a pressure or flow sensor. This can be a commercial electronic pressure regulator or mass flow controller, of which there are many to choose from. The physics of gas flow through a capillary is inherently not affected much by temperature because of balanced effects on viscosity, density, and speed of sound. The calculated and measured temperature coefficient of flow rate is roughly 0.2%/C. The net result is a maximized gas flow stability, monotonicity, resolution, and repeatability.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A gas delivery conduit configured to deliver gas to a device, the conduit comprising:

an input end maintained at a first potential into which a gas is delivered from a source under a regulated pressure;

a pressure regulator coupled to the input end for delivering a regulated flow of gas to the conduit;

an output end maintained at a second potential through which the gas is delivered to the device, a potential difference between the first potential and second potential forming an electric field, a direction of gas flow moving through the conduit from the input end to the output end, wherein a gas flow rate at the output end is dependent upon the regulated pressure delivered at the input end; and a first plurality of electrically nonconductive conduit windings between the input end and output end arranged such that the electric field running between the input end and output end runs substantially perpendicularly across the plurality of conduit windings and the direction of gas flow through the conduit.

2. The gas delivery conduit of claim 1, wherein the first potential is ground and the absolute value of the second potential is in the range of between about 500V and 50 kV or greater.

3. The gas delivery conduit of claim 1, wherein the windings form a flat spiral subtending a curve between the input end and output end.

4. The gas delivery conduit of claim 3, wherein the input end is on an outside of the spiral and the output end is on an inside of the spiral.

5. The gas delivery conduit of claim 1, wherein the windings form a three-dimensional conical helix with the input end on one of either a wide end of the conical helix or a narrow end adjacent an apex of the conical helix, and the output end on the other of the wide end of the conical helix or narrow end adjacent an apex of the conical helix.

6. The gas delivery conduit of claim 1, wherein the windings form a cylindrical shape from the first potential at one end of the cylinder to the second potential at an opposite end of the cylinder.

7. The gas delivery conduit of claim 1, wherein the windings are disposed about an insulative material.

8. The gas delivery conduit of claim 1, further including removable fittings connected to each of the input end and to the output end.

9. The gas delivery conduit of claim 1, further including a second plurality of nonconductive conduit windings running in parallel to the first plurality of nonconductive conduit windings and having an input end coupled to a pressure transducer.

10. The gas delivery conduit of claim 1, wherein the conduit is potted in a high voltage insulating compound for use in air.

11. The gas delivery conduit of claim 1, wherein the conduit is immersed in a dielectric liquid.

12. The gas delivery conduit of claim 1, further including a fluid barrier plate interposed between a dielectric liquid and the conduit.

13. The gas delivery conduit of claim 1, wherein the first plurality of electrically nonconductive conduit windings is greater than 5.

14. The gas delivery conduit of claim 1, wherein the first plurality of electrically nonconductive conduit windings is greater than 10.

15. A gas delivery conduit, comprising:

a spool having upper and lower ends, with outer annular portions of the spool maintained at a first potential and inner annular portions of the spool maintained at a second potential, different from the first potential, such that a radial electric field exists between the first and second potentials; and an elongate microcapillary arranged in a spiral having a plurality of windings interposed between the upper and lower ends of the spool, with one of an input end or output end at the first potential and the other of the input end or output end at the second potential, the microcapillary being configured to transfer a gas along the microcapillary in a flow direction substantially perpendicular to the electric field.

16. The gas delivery conduit of claim 15 wherein the upper and lower ends of the spool include outer surfaces comprising a plurality of concentric annular ridges.

17. The gas delivery conduit of claim 15, where the microcapillary interposed between the upper and lower ends of the spool is embedded within a potting material.

18. The gas delivery conduit of claim 17, wherein the spool upper end includes a plurality of apertures passing between an outer and inner surface of the spool upper end and adjacent the microcapillary spiral, with the apertures being configured to vent air bubbles outgassed from the potting material.

19. A method for flowing gas within a gas line between input and output ends having a large difference in potential to mitigate possible high voltage breakdown and arcing through the gas line, comprising the steps of:

arranging a plurality of adjacent windings of the gas line such that a cross-section of the gas line is substantially perpendicularly to an electric field created by the difference in potential between the input and output ends; and flowing the gas along the gas line substantially perpendicular to the electric field.

20. The method of claim 19, wherein the step of arranging includes disposing the windings in a flat spiral so that the input end is at an outside, larger diameter end, of the spiral and the output end is at an inside, smaller diameter end, of the spiral.

21. The method of claim 19, wherein the step of arranging includes disposing the windings in a three-dimensional spiral arranged about a conical structure.

22. The gas delivery conduit of claim 1, wherein the conduit is coupled to a plasma chamber that is isolated from ground for processing semiconductors or supplying a source of charged particles to a substrate.

23. The gas delivery conduit of claim 15, wherein the conduit is coupled to a plasma chamber that is isolated from ground for processing semiconductors or supplying a source of charged particles to a substrate.

24. The method of claim 19, further comprising the step of coupling the gas line to a plasma chamber that is isolated from ground for processing semiconductors or supplying a source of charged particles to a substrate.

* * * * *